United States Patent
Kansal et al.

(10) Patent No.: US 10,205,445 B1
(45) Date of Patent: Feb. 12, 2019

(54) CLOCK DUTY CYCLE CORRECTION CIRCUIT

(71) Applicant: Synopsys, Inc., Mountain View, CA (US)

(72) Inventors: Shourya Kansal, Bengaluru (IN); Biman Chattopadhyay, Karnataka (IN); Ravi Mehta, Karnataka (IN); Jayesh Wadekar, Maharashtra (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/862,559

(22) Filed: Jan. 4, 2018

(30) Foreign Application Priority Data

Sep. 25, 2017 (IN) .............................. 201741034036

(51) Int. Cl.
*H03K 3/017* (2006.01)
*H03K 5/04* (2006.01)
*H03K 7/08* (2006.01)
*H03F 3/45* (2006.01)

(52) U.S. Cl.
CPC ........... *H03K 7/08* (2013.01); *H03F 3/45179* (2013.01)

(58) Field of Classification Search
USPC ........................................ 327/172, 174, 175
See application file for complete search history.

(56) References Cited

U.S. PATENT DOCUMENTS

| | | | | |
|---|---|---|---|---|
| 3,781,720 | A | * 12/1973 | Mueller | ............ H04L 25/03038 333/18 |
| 5,317,207 | A | * 5/1994 | Mortensen | ....... H03K 19/00346 326/26 |
| 5,572,158 | A | 11/1996 | Lee et al. | |
| 6,169,434 | B1 | 1/2001 | Portmann | |
| 6,184,741 | B1 | * 2/2001 | Ghilardelli | ............. G11C 5/145 327/536 |
| 6,320,438 | B1 | 11/2001 | Arcus | |
| 6,418,040 | B1 | * 7/2002 | Meng | ........................ F28D 5/00 307/109 |
| 6,429,724 | B1 | * 8/2002 | Ogura | ................... H02M 3/073 327/390 |

(Continued)

OTHER PUBLICATIONS

K. Agarwal et al., "A Duty-Cycle Correction Circuit for High-Frequency Clocks", 2006 Symposium on VLSI Circuits Digest of Technical Papers, 2006, pp. 106-107, Honolulu, HI, USA.

(Continued)

*Primary Examiner* — Adam Houston
(74) *Attorney, Agent, or Firm* — Fenwick & West LLP

(57) ABSTRACT

A duty cycle correction (DCC) circuit includes first and second pluralities of logic gates, a low pass filter, an error amplifier, and a differential amplifier. The DCC circuit receives first and second clock signals from the VCO. The first and second pluralities of logic gates receive first and second superimposed clock signals and generate first and second output clock signals, respectively. The error amplifier rectifies a common error of the first and second output clock signals, and generates a common mode error voltage signal. The differential amplifier generates first and second error signals based on the common mode error voltage signal. The first and second error signals converge the duty cycles of the first and second output clock signals to a 50% duty cycle.

19 Claims, 2 Drawing Sheets

(56) References Cited

U.S. PATENT DOCUMENTS

| | | | |
|---|---|---|---|
| RE38,454 E * | 3/2004 | Walters | G06F 1/28 |
| | | | 323/272 |
| 6,833,743 B2 | 12/2004 | Gu et al. | |
| 7,477,093 B2 * | 1/2009 | Al-Shamma | H02M 3/073 |
| | | | 327/536 |
| 8,384,457 B2 | 2/2013 | Ozgun et al. | |
| 8,513,997 B2 | 8/2013 | Hesen et al. | |
| 9,008,685 B1 * | 4/2015 | Gold | H04W 72/08 |
| | | | 455/456.1 |
| 10,069,323 B2 * | 9/2018 | Uno | H02M 3/005 |
| 2001/0022735 A1 * | 9/2001 | Zanuccoli | H02M 3/073 |
| | | | 363/60 |
| 2004/0080964 A1 * | 4/2004 | Buchmann | H02M 3/07 |
| | | | 363/60 |
| 2006/0043947 A1 * | 3/2006 | Clavette | H02M 3/158 |
| | | | 323/282 |
| 2006/0076935 A1 * | 4/2006 | Wiseman | B64G 1/405 |
| | | | 322/20 |
| 2006/0158923 A1 * | 7/2006 | Namekawa | G11C 5/145 |
| | | | 365/149 |
| 2006/0164155 A1 * | 7/2006 | Ragone | G11C 5/145 |
| | | | 327/536 |
| 2006/0279509 A1 * | 12/2006 | Milanesi | H03F 3/4521 |
| | | | 345/100 |
| 2008/0204097 A1 | 8/2008 | Wu | |
| 2014/0210359 A1 * | 7/2014 | Raval | H02M 3/156 |
| | | | 315/186 |
| 2014/0371931 A1 * | 12/2014 | Lin | H02S 10/00 |
| | | | 700/287 |
| 2015/0042300 A1 * | 2/2015 | Peker | H02M 3/156 |
| | | | 323/274 |
| 2015/0288353 A1 * | 10/2015 | Kalluru | H03K 5/023 |
| | | | 365/185.12 |
| 2015/0303920 A1 * | 10/2015 | Friedman | H03K 19/018521 |
| | | | 326/81 |
| 2016/0344297 A1 * | 11/2016 | Lee | H02M 3/33584 |
| 2017/0010729 A1 * | 1/2017 | Chuang | G06F 3/0414 |
| 2017/0149331 A1 * | 5/2017 | Kruiskamp | H02M 3/073 |
| 2017/0212399 A1 * | 7/2017 | Tarng | E06B 7/10 |
| 2017/0317582 A1 * | 11/2017 | Leong | H02M 1/14 |

OTHER PUBLICATIONS

S. Patil et al., "Duty Cycle Correction Using Negative Feedback Loop", MIXDES 2009, 16th International Conference Mixed Design of Integrated Circuits & Systems, Jun. 25-27, 2009, pp. 424-426, Lodz, Poland.

H.Y. Huang et al., "Low-Power 50% Duty Cycle Corrector", 2008 IEEE International Symposium on Circuits and Systems, 2008, pp. 2362-2365, Seattle, WA, USA.

* cited by examiner

CLOCK DUTY CYCLE CORRECTION CIRCUIT

CROSS-RELATED APPLICATIONS

This application claims priority of Indian Application Serial No. 201741034036, filed Sep. 25, 2017, the contents of which are incorporated herein by reference.

FIELD OF THE INVENTION

The present invention relates generally to the field of integrated circuits, and, more particularly, to a duty cycle correction circuit.

BACKGROUND

Digital circuits, and, more particularly, synchronous digital circuits employ a periodically oscillating signal, i.e., a clock signal for coordinating various functions performed by the synchronous digital circuits. Such functions typically include sampling data that is transmitted within and outside the synchronous digital circuits. The clock signal may be generated by crystal oscillators, voltage controlled oscillators (VCOs), astable multivibrators, and the like. A duty cycle of the clock signal is defined as a ratio of an ON time period of the clock signal to a total time period of the clock signal. For example, when the clock signal has a duty cycle of 75%, the clock signal remains ON for 75% of the total time period, and remains OFF for 25% of the total time period.

Many of the synchronous digital circuits that employ clock and data recovery (CDR) circuits, phase interpolators, phase locked loops (PLLs), and the like for performing data serialization and deserialization use differential clock signals for sampling serialized data. The differential clock signals include first and second differential clock signals that are at a phase difference of 180° with respect to each other. It is imperative that the duty cycles corresponding to the first and second differential clock signals are at 50% for facilitating errorless sampling of the serialized data. Typically, the aforementioned circuits employ a voltage controlled oscillator (VCO) for generating the first and second differential clock signals. Due to changes in physical conditions such as temperature, aging of the VCO, voltage fluctuation, electromagnetic noise, and the like, the duty cycles corresponding to the first and second differential clock signals may deviate from 50%, thereby causing errors in the duty cycles.

The errors in the duty cycles of the first and second differential clock signals can be classified into differential and common errors. The differential errors in the first and second differential clock signals are caused when the duty cycles of the first and second differential clock signals deviate differentially from 50%. The common errors in the first and second differential clock signals are caused when the duty cycles of the first and second differential clock signals deviate equally from 50%. The differential and common errors in the first and second differential clock signals may lead to jitter therein. Jitter may lead to data loss during data sampling.

To overcome the aforementioned problems, the synchronous digital circuits employ duty cycle correction (DCC) circuits. The DCC circuits rectify the duty cycles to 50% duty cycle for facilitating errorless sampling of the serialized data. The DCC circuits known in the art achieve duty cycle correction using charge pumps and integrators. Such DCC circuits employ a negative feedback configuration for adding a DC offset signal to the first and second differential clock signals. Based on the DC offset signal, the DCC circuits generate corrected first and second differential clock signals. However, inclusion of the charge pump in such DCC circuits leads to a complex circuit design thereof. Further, the power consumed by the DCC circuits is high.

Other DCC circuits employ differential amplifiers for rectifying the duty cycles. The differential amplifiers receive the first and second differential clock signals, and generate the corrected first and second differential clock signals by amplifying the difference between the first and second differential clock signals. However, the DCC circuits employing the differential amplifiers fail to rectify the common errors in the first and second differential clock signals, thereby inducing jitter in the first and second differential clock signals.

Hence, it would be advantageous to have a DCC circuit that has a simple design, corrects the differential and common errors in the first and second differential clock signals, and prevents jitter in the first and second differential clock signals.

SUMMARY

In one embodiment of the present invention, a duty cycle correction circuit is provided. The duty cycle correction circuit includes first and second pluralities of logic gates, a low pass filter, an error amplifier, and a differential amplifier. The first and second pluralities of logic gates receive first and second superimposed clock signals and generate first and second output clock signals, respectively. The low pass filter is connected to the first and second pluralities of logic gates and receives the first and second output clock signals, respectively. The low pass filter outputs first and second filtered clock signals. The error amplifier receives first and second voltage signals, compares the first voltage signal with the second voltage signal, and generates a common mode error voltage signal. The first voltage signal is an average of the first and second filtered clock signals. The differential amplifier is connected to the low pass filter and the error amplifier, and receives the first and second filtered clock signals and the common mode error voltage signal, respectively. The differential amplifier outputs first and second error signals. The differential amplifier superimposes the first and second error signals on first and second filtered differential clock signals and generates the first and second superimposed clock signals, respectively. The first and second pluralities of logic gates converge duty cycles of the first and second output clock signals towards a desired duty cycle based on the first and second superimposed clock signals, respectively.

In another embodiment of the present invention, a duty cycle correction circuit is provided. The duty cycle correction circuit includes first and second pluralities of logic gates, a low pass filter, a resistive network, an error amplifier, and a differential amplifier. The first and second pluralities of logic gates receive first and second superimposed clock signals and generate first and second output clock signals, respectively. The low pass filter is connected to the first and second pluralities of logic gates and receives the first and second output clock signals, respectively. The low pass filter outputs first and second filtered clock signals. The resistive network is connected to the low pass filter and receives the first and second filtered clock signals. The low pass filter generates a first voltage signal. The first voltage signal is an average of the first and second filtered clock signals. The error amplifier receives a second voltage signal.

The error amplifier is connected to the resistive network and receives the first voltage signal therefrom. The error amplifier compares the first voltage signal with the second voltage signal, and generates a common mode error voltage signal. The differential amplifier is connected to the low pass filter and the error amplifier and receives the first and second filtered clock signals and the common mode error voltage signal, respectively. The differential amplifier outputs first and second error signals. The differential amplifier superimposes the first and second error signals on first and second filtered differential clock signals and generates the first and second superimposed clock signals, respectively. The first and second pluralities of logic gates converge duty cycles of the first and second output clock signals towards a desired duty cycle based on the first and second superimposed clock signals, respectively.

Various embodiments of the present invention provide a duty cycle correction circuit. The duty cycle correction circuit includes first and second pluralities of logic gates, a low pass filter, an error amplifier, and a differential amplifier. The first and second pluralities of logic gates receive first and second superimposed clock signals, and generate first and second output clock signals, respectively. The first and second pluralities of logic gates input the first and second output clock signals to the low pass filter for creating a feedback loop. The low pass filter averages out the first and second output clock signals, and generates first and second filtered clock signals, respectively. The error amplifier compares an average voltage signal with a first voltage signal, and generates a common mode error voltage signal. The average voltage signal is an average of the first and second filtered clock signals. The error amplifier further outputs the common mode error voltage signal to the differential amplifier. The differential amplifier receives the first and second filtered clock signals from the low pass filter. The differential amplifier further generates first and second error signals based on the common mode error voltage signal, and the first and second filtered clock signals. The differential amplifier superimposes the first and second error signals on first and second filtered differential clock signals and generates first and second superimposed clock signals, respectively. The first and second pluralities of logic gates change rise and fall times of the first and second superimposed clock signals based on the first and second error signals, respectively. The first and second pluralities of logic gates converge duty cycles of the first and second output clock signals towards a desired duty cycle based on the first and second superimposed clock signals, respectively.

The duty cycle correction circuit is easy to manufacture and has a simple design. Further, the duty cycle correction circuit prevents jitter and eliminates common and differential errors in the first and second clock signals.

BRIEF DESCRIPTION OF DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF EMBODIMENTS

As used in the specification and claims, the singular forms "a", "an" and "the" include plural references unless the context clearly dictates otherwise. For example, the term "an article" may include a plurality of articles unless the context clearly dictates otherwise.

Those with ordinary skill in the art will appreciate that the elements in the figures are illustrated for simplicity and clarity and are not necessarily drawn to scale. For example, the dimensions of some of the elements in the figures may be exaggerated, relative to other elements, in order to improve the understanding of the present invention.

There may be additional components described in the foregoing application that are not depicted on one of the described drawings. In the event such a component is described, but not depicted in a drawing, the absence of such a drawing should not be considered as an omission of such design from the specification.

Before describing the present invention in detail, it should be observed that the present invention utilizes a combination of system components which constitutes a data transmission system. Accordingly, the components and the method steps have been represented, showing only specific details that are pertinent for an understanding of the present invention so as not to obscure the disclosure with details that will be readily apparent to those with ordinary skill in the art having the benefit of the description herein.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

Figure 1:
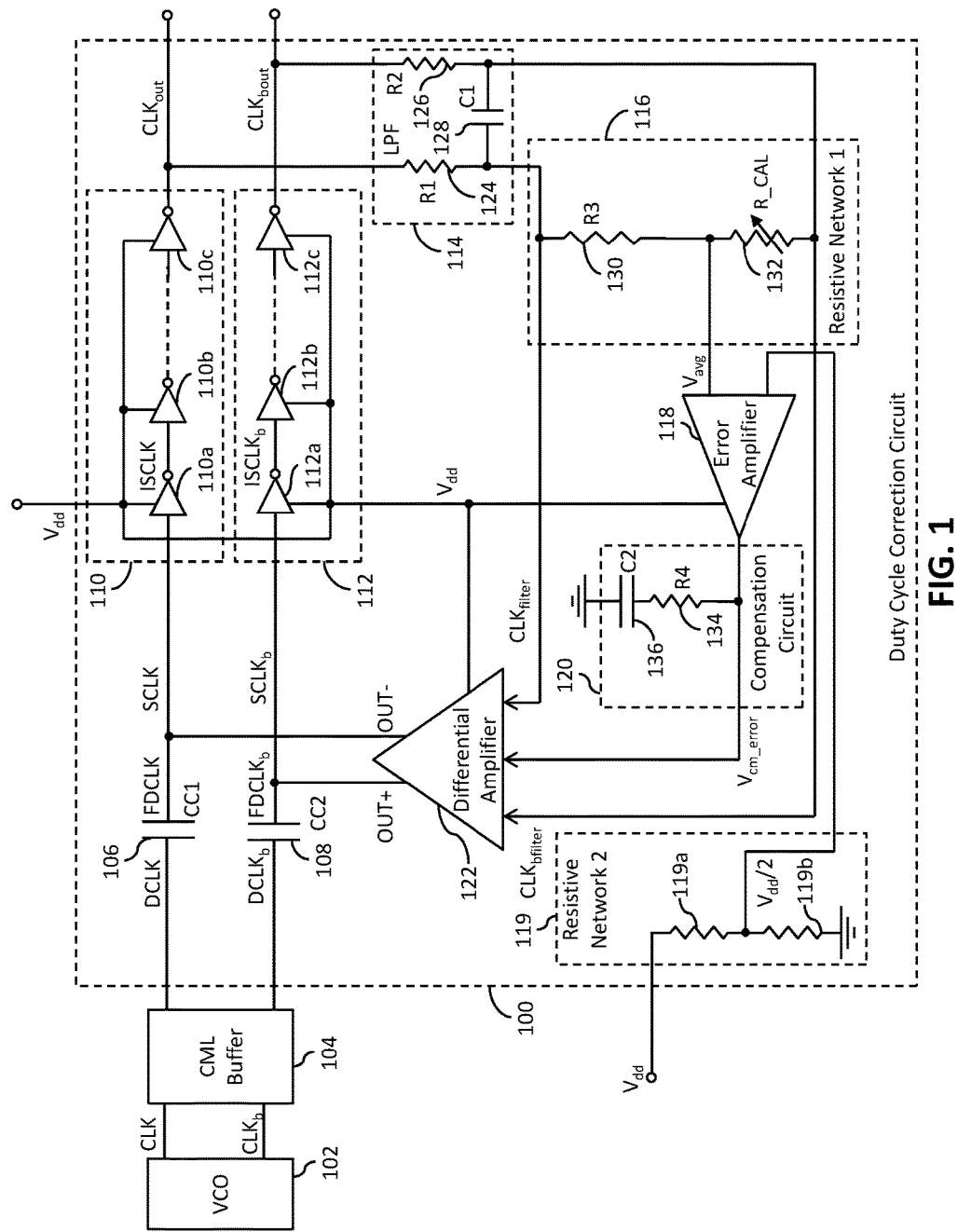
FIG. 1 is a schematic block diagram of a duty cycle correction (DCC) circuit in accordance with an embodiment of the present invention.

Referring now to FIG. 1, a duty cycle correction (DCC) circuit 100 in accordance with an embodiment of the present invention is shown. The DCC circuit 100 is connected to a voltage controlled oscillator (VCO) 102. The DCC circuit 100 includes a current mode logic (CML) buffer 104, a first alternating current (AC) coupling capacitor 106, or CC1, a second AC coupling capacitor 108, or CC2, first and second pluralities of logic gates 110 and 112, a low pass filter 114, a first resistive network 116, an error amplifier 118, a second resistive network 119, a compensation circuit 120, and a differential amplifier 122. The first plurality of logic gates 110 includes multiple inverters, out of which first through third inverters 110a-110c are shown. The second plurality of logic gates 112 includes multiple inverters, out of which fourth through sixth inverters 112a-112c are shown. Each of the first through third inverters 110a-110c and the fourth through sixth inverters 112a-112c includes a p-type metal oxide semiconductor field-effect transistor (PMOSFET) (not shown) and an n-type MOSFET (NMOSFET) (not shown).

The VCO 102 is a source coupled (also known as CML) VCO that employs complementary metal oxide semiconductor (CMOS) technology. The VCO 102 generates first and second clock signals CLK and $CLK_b$. The first and second clock signals CLK and $CLK_b$ are CML clock signals. The first and second clock signals CLK and $CLK_b$ may be employed in digital interfaces such as digital visual interface (DVI) and high-definition multimedia interface (HDMI) for serial transmission of digital audio and video data. Further, high speed telecommunication systems also employ the first and second clock signals CLK and $CLK_b$ in devices such as serial data transceivers, frequency synthesizers, and the like. The first and second clock signals CLK and $CLK_b$ are differential clock signals, and have a phase difference of 180° therebetween.

The duty cycle of a clock signal is defined as a ratio of an ON time period $T_{ON}$ to a total time period of the clock signal T. Hence, the duty cycle of the clock signal is given by equation (1):

$$\text{Duty Cycle} = T_{ON}/T \qquad (1)$$

Physical conditions such as temperature, voltage fluctuations, and the like surrounding the VCO 102 as well as aging thereof leads to deviation of the duty cycles of the first and second clock signals CLK and $CLK_b$, respectively, from a desired duty cycle, i.e., 50% duty cycle. The duty cycles of the first and second clock signals CLK and $CLK_b$ will hereinafter be referred to as "first and second duty cycles", respectively. The deviation of the first and second duty cycles from the desired duty cycle further leads to common errors and differential errors. The first and second clock signals CLK and $CLK_b$ have a differential error when the first and second duty cycles do not have the same values and a sum of the first and second duty cycles adds up to 100%. For example, the first clock signal CLK has a duty cycle of 40% and the second clock signal $CLK_b$ has a duty cycle of 60%. Thus, the first and second clock signals CLK and $CLK_b$ have a differential error therebetween. The first and second clock signals CLK and $CLK_b$ have a common error when the first and second duty cycles have the same value. For example, the first clock signal CLK has a duty cycle of 60% and the second clock signal $CLK_b$ has a duty cycle of 60%. Thus, the first and second clock signals CLK and $CLK_b$ have a common error therebetween.

The CML buffer 104 is connected to the VCO 102 to receive the first and second clocks signals CLK and $CLK_b$. The CML buffer 104 drives the DCC circuit 100 and provides buffering between the VCO 102 and the DCC circuit 100. The CML buffer 104 outputs first and second differential clock signals DCLK and $DCLK_b$ based on the first and second clock signals CLK and $CLK_b$, respectively.

The first and second AC coupling capacitors 106 and 108 are connected to the CML buffer 104 to receive the first and second differential clock signals DCLK and $DCLK_b$, respectively. The first and second AC coupling capacitors 106 and 108 filter a DC component of the first and second differential clock signals DCLK and $DCLK_b$ and output the first and second filtered differential clock signals FDCLK and $FDCLK_b$ as AC signals at first and second nodes, respectively.

The first and second pluralities of logic gates 110 and 112 receive first and second superimposed clock signals SCLK and $SCLK_b$, by way of the first and second nodes, respectively. The differential amplifier 122 outputs first and second error signals OUT+ and OUT− at the first and second nodes to superimpose the first and second error signals OUT+ and OUT− on the first and second filtered differential clock signals FDCLK and $FDCLK_b$, respectively. The first and second error signals OUT+ and OUT− are differential signals. It will be apparent to a person skilled in the art that the superimposition of the first and second error signals OUT+ and OUT− on the first and second filtered differential clock signals FDCLK and $FDCLK_b$ generates the first and second superimposed clock signals SCLK and $SCLK_b$ at the first and second nodes, respectively. The generation of the first and second error signals OUT+ and OUT− will be explained in conjunction with FIG. 2.

The first and second pluralities of logic gates 110 and 112 are connected to a voltage source (not shown) for receiving a supply voltage signal $V_{dd}$. Thus, each of the first through third inverters 110a-110c and the fourth through sixth inverters 112a-112c receive the supply voltage signal $V_{dd}$. The number of inverters in the first and second pluralities of logic gates 110 and 112 is determined by a desired amplification level of the first and second filtered differential clock signals FDCLK and $FDCLK_b$, and gains of each inverter of the first and second pluralities of logic gates 110 and 112. Further, the first and second pluralities of logic gates 110 and 112 includes an even number of inverters. The first and second pluralities of logic gates 110 and 112 further generate first and second output clock signals $CLK_{out}$ and $CLK_{bout}$ based on the first and second superimposed clock signals SCLK and $SCLK_b$, respectively. The first and second superimposed clock signals SCLK and $SCLK_b$ are CML signals. However, the first and second superimposed clock signals SCLK and $SCLK_b$ are not rail-to-rail signals. The first and second pluralities of logic gates 110 and 112 hence amplify the first and second superimposed clock signals SCLK and $SCLK_b$ and generate the first and second output clock signals $CLK_{out}$ and $CLK_{bout}$ as rail-to-rail signals.

The low pass filter 114 is connected to the first and second pluralities of logic gates 110 and 112 to receive the first and second output clock signals $CLK_{out}$ and $CLK_{bout}$, respectively. The first and second output clock signals $CLK_{out}$ and $CLK_{bout}$ have third and fourth duty cycles, respectively. In an embodiment, the low pass filter 114 includes a first resistor 124, or R1, a second resistor 126, or R2, and a first capacitor 128, or C1. The low pass filter 114 acts as an averaging filter that averages the first and second output clock signals $CLK_{out}$ and $CLK_{bout}$ and outputs first and second filtered clock signals $CLK_{filter}$ and $CLK_{bfilter}$, respectively.

The first resistive network 116 is connected to the low pass filter 114 and receives the first and second filtered clock signals $CLK_{filter}$ and $CLK_{bfilter}$ therefrom. In an embodiment, the first resistive network 116 includes a third resistor 130, or R3, and a fourth resistor 132, or R_CAL. The fourth resistor 132 is a variable resistor. The first resistive network 116 determines an average of the first and second filtered clock signals $CLK_{filter}$ and $CLK_{bfilter}$, and outputs a first voltage signal $V_{avg}$, i.e., an average voltage signal $V_{avg}$, at a voltage tap. The error amplifier 118 may have an input offset voltage that is not equal to 0V. The input offset voltage may cause the output of the error amplifier 118 to be erroneous. The fourth resistor 132 thus calibrates the error amplifier 118 by eliminating the input offset voltage and prevents errors in the output of the error amplifier 118. It will be understood by those of skill in the art that the first resistive network 116 can include any number of resistors.

The error amplifier 118 has a first terminal that is connected to the first resistive network 116 to receive the average voltage signal $V_{avg}$. The error amplifier 118 has a second terminal that is connected to the second resistive network 119. The second resistive network 119 includes fifth and sixth resistors 119a and 119b. The fifth resistor 119a receives the supply voltage signal $V_{dd}$ from the voltage source (not shown). The sixth resistor 119b is connected to ground. The second resistive network 119 generates a second voltage signal $V_{dd}/2$, i.e., a half supply voltage signal $V_{dd}/2$. An input terminal of the error amplifier 118 is connected to the second resistive network 119 and receives the half supply voltage signal $V_{dd}/2$ therefrom. It will be understood by those of skill in the art that the second resistive network 119 can include any number of resistors. The error amplifier 118 compares the average voltage signal $V_{avg}$ to the half supply voltage signal $V_{dd}/2$. Based on the comparison, the error amplifier 118 generates a common mode error voltage signal $V_{cm\_error}$ at an output terminal thereof. In one example, the first and second output clock signals $CLK_{out}$ and $CLK_{bout}$ have the third and fourth duty cycles at 60% and 60%, respectively, and the first and second output clock signals $CLK_{out}$ and $CLK_{bout}$ swing from 0 V to $V_{dd}$. Hence, the first and second filtered clock signals $CLK_{filter}$ and $CLK_{bfilter}$ have DC voltage values of 0.6 $V_{dd}$ and 0.6 $V_{dd}$, respectively. The first resistive network 116 outputs the average voltage signal $V_{avg}$ as 0.6 $V_{dd}$. The error amplifier 118 compares the average voltage signal $V_{avg}$ as 0.6 $V_{dd}$ to the half supply voltage signal $V_{dd}/2$ as 0.5 $V_{dd}$ and generates the common mode error voltage signal $V_{cm\_error}$ at an output terminal thereof.

The compensation circuit 120 is connected to the output terminal of the error amplifier 118 to receive the common mode error voltage signal $V_{cm\_error}$. In an embodiment, the compensation circuit 120 includes a seventh resistor 134, or R4, and a second capacitor 136, or C2. The compensation circuit 120 facilitates the stability of the DCC circuit 100 once the DCC circuit 100 starts operating. The low pass filter 114, the first resistive network 116, the error amplifier 118, and the differential amplifier 122 form a negative feedback loop for controlling the third and fourth duty cycles. Since the DCC circuit 100 includes the negative feedback loop, the first and second output clock signals $CLK_{out}$ and $CLK_{bout}$ are prone to ringing. Ringing in the first and second output clock signals $CLK_{out}$ and $CLK_{bout}$ may lead to instability in the DCC circuit 100. The compensation circuit 120 prevents ringing in the first and second output clock signals $CLK_{out}$ and $CLK_{bout}$ and hence stabilizes the DCC circuit 100.

The differential amplifier 122 has first and second terminals connected to the low pass filter 114 to receive the first and second filtered clock signals $CLK_{filter}$ and $CLK_{bfilter}$, respectively. The differential amplifier 122 has a third terminal connected to the output terminal of the error amplifier 118 to receive the common mode error voltage signal $V_{cm\_error}$. The differential amplifier 122 further receives the supply voltage signal $V_{dd}$. The differential amplifier 122 outputs the first and second error signals OUT+ and OUT− based on the first and second filtered clock signals $CLK_{filter}$ and $CLK_{bfilter}$, respectively, and the common mode error voltage signal $V_{cm\_error}$. The functioning of the differential amplifier 122 will be explained in conjunction with FIG. 2.

Figure 2:
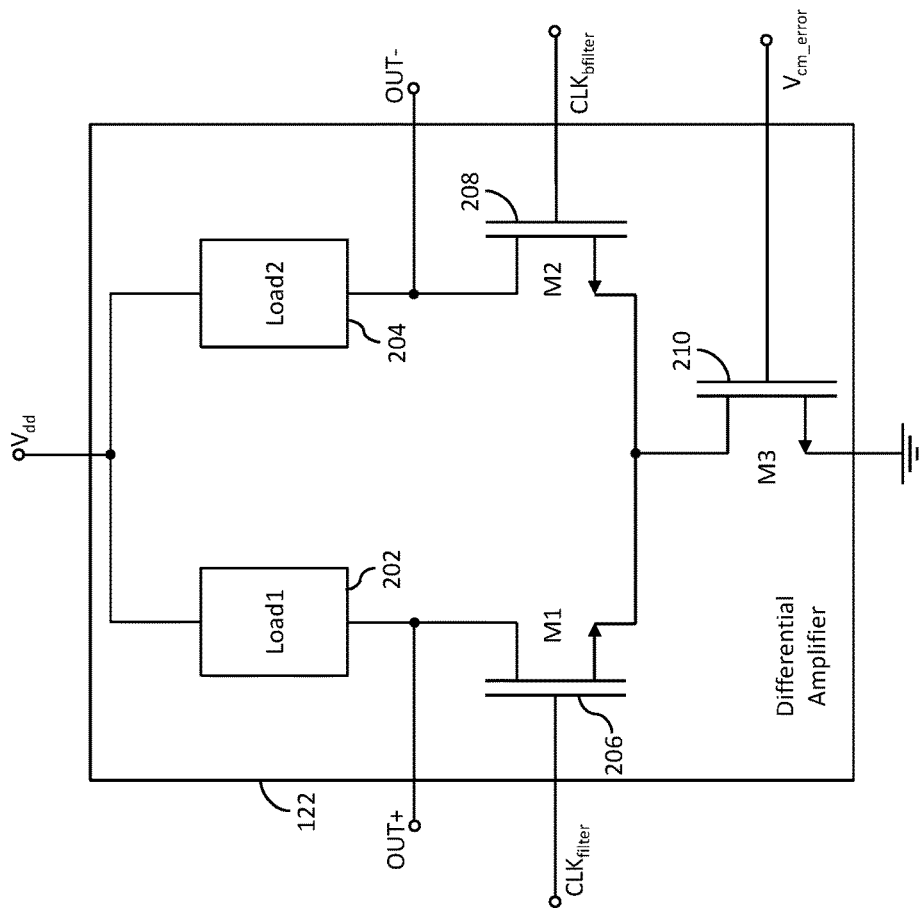
FIG. 2 is a schematic block diagram of a differential amplifier of the DCC circuit of FIG. 1, in accordance with an embodiment of the present invention.

Referring now to FIG. 2, the differential amplifier 122 in accordance with an embodiment of the present invention is shown. The differential amplifier 122 includes first and second loads 202 and 204, and a first MOSFET 206, or M1, a second MOSFET 206, or M2, and a third MOSFET 210, or M3. In an embodiment, the first through third MOSFETs 206-210 are n-type MOSFETS.

The first and second loads 202 and 204 are resistive loads. The first load 202 is connected between the voltage source (not shown) and a source terminal of the first MOSFET 206. The second load 204 is connected between the voltage source (not shown) and a source terminal of the second MOSFET 208. A gate terminal of the first MOSFET 206 is connected to the low pass filter 114 and receives the first filtered clock signal $CLK_{filter}$ therefrom. A gate terminal of the second MOSFET 208 is connected to the low pass filter 114 and receives the second filtered clock signal $CLK_{bfilter}$ signal therefrom. Drain terminals of the first and second MOSFETs 206 and 208 are connected to a source terminal of the third MOSFET 210. The drain terminal of the third MOSFET 210 is connected to the output terminal of the error amplifier 118 and receives the common mode error voltage signal $V_{cm\_error}$ therefrom. A drain terminal of the third MOSFET 210 is connected to ground. The gate terminal of the third MOSFET 210 is controlled by the common mode error voltage signal $V_{cm\_error}$. The third MOSFET 210 hence operates in the saturation region based on the common mode error voltage signal $V_{cm\_error}$.

The differential amplifier 122 determines a difference between the first and second filtered clock signals $CLK_{filter}$ and $CLK_{bfilter}$. The differential amplifier 122 amplifies the difference between the first and second filtered clock signals $CLK_{filter}$ and $CLK_{bfilter}$, and outputs the first and second error signals OUT+ and OUT− based on first and second resistance values of the first and second loads 202 and 204, respectively, and the common mode error voltage signal $V_{cm\_error}$. The first and second error signals OUT+ and OUT− are further superimposed with the first and second filtered differential clock signals FDCLK and $FDCLK_b$ at the first and second nodes, respectively. The negative feedback loop increases or decreases the third and fourth duty cycles by way of the first and second error signals OUT+ and OUT−. The first and second error signals OUT+ and OUT− modify a common mode of the first and second filtered differential clock signals FDCLK and $FDCLK_b$ over subsequent clock cycles of the first and second output clock signals $CLK_{out}$ and $CLK_{bout}$, respectively.

The PMOSFET (not shown) and NMOSFET (not shown) of each of the first through third inverters 110a-110c and the fourth through sixth inverters 112a-112c have unequal overdrive voltages. In operation, the first and fourth inverters 110a and 112a receive the first and second superimposed clock signals SCLK and $SCLK_b$, respectively. The first and fourth inverters 110a and 112a generate first and second inverted superimposed clock signals ISCLK and $ISCLK_b$, respectively, at the modified common mode. The first and second inverted superimposed clock signals ISCLK and $ISCLK_b$ have unequal rise and fall times due to the unequal overdrive voltages of the PMOSFETs (not shown) and the NMOSFETs (not shown) of the first and fourth inverters 110a and 112a, and the new common mode of the first and second superimposed clock signals SCLK and $SCLK_b$, respectively. Further, the new common mode of the first and second inverted superimposed clock signals ISCLK and $ISCLK_b$ leads to elimination of the common and differential errors from the first and second output clock signals $CLK_{out}$ and $CLK_{bout}$, respectively, over subsequent clock cycles thereof.

The unequal rise and fall times in the first and second inverted superimposed clock signals ISCLK and $ISCLK_b$ cause the third and fourth duty cycles to converge to 50%, respectively. In one example, the first and second duty cycles are at 60% and 40%, respectively. When the DCC circuit 100 starts operating, the third and fourth duty cycles are also at 60% and 40%, respectively. Further, a difference between the first and second error signals OUT+ and OUT− is 0V. The first and second output clock signals $CLK_{out}$ and $CLK_{bout}$ are fed-back into the negative feedback loop for converging duty cycles of the first and second superimposed signals SCLK and $SCLK_b$ to 50%. Hence, the third duty cycle converges from 60% to 50%. Further, the fourth duty cycle converges from 40% to 50%. Thus, the first and second pluralities of logic gates 110 and 112 converge the third and fourth duty cycles to 50% over subsequent clock cycles of the first and second superimposed signals SCLK and $SCLK_b$, respectively.

The DCC circuit 100 has a simple design and is easy to implement in serial communication networks that employ differential CML clock signals. Simple design of the DCC circuit 100 facilitates an easy manufacturing and a low cost thereof. Further, the DCC circuit 100 consumes low power. The DCC circuit 100 rectifies the common mode errors and the differential errors in the first and second clock signals CLK and $CLK_b$ to achieve a 50% duty cycle of the third and fourth duty cycles. The DCC circuit 100 further eliminates jitter in data sampling in the serial communication networks, thereby preventing loss and erroneous sampling of the serialized data.

The terms first and second logic states have been used herein to distinguish before high and low signals. For example, the first logic state could signify a signal that is 0V while a second logic state would then indicate a signal that has a logical '1' value, with the actual voltage value for logic 1 depending on circuit technology. The circuits described herein also can be designed using either positive or negative logic, so an active signal in one embodiment could be a logic '0' and an inactive signal would then have a logic value of '1'.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A duty cycle correction circuit, comprising:
   first and second pluralities of logic gates for receiving first and second superimposed clock signals and generating first and second output clock signals, respectively;
   a low pass filter connected to the first and second pluralities of logic gates for receiving the first and second output clock signals and outputting first and second filtered clock signals;
   an error amplifier that receives first and second voltage signals, compares the first voltage signal with the second voltage signal, and generates a common mode error voltage signal, wherein the first voltage signal is an average of the first and second filtered clock signals; and
   a differential amplifier connected to the low pass filter and the error amplifier for receiving the first and second filtered clock signals and the common mode error voltage signal, respectively, and outputting first and second error signals, wherein the differential amplifier superimposes the first and second error signals on first and second filtered differential clock signals for generating the first and second superimposed clock signals, respectively, and wherein the first and second pluralities of logic gates converge duty cycles of the first and second output clock signals towards a desired duty cycle based on the first and second superimposed clock signals, respectively.

2. The duty cycle correction circuit of claim 1, wherein the desired duty cycle is 50%.

3. The duty cycle correction circuit of claim 1, further comprising a buffer for receiving first and second clock signals and outputting first and second differential clock signals, respectively.

4. The duty cycle correction circuit of claim 3, further comprising first and second capacitors connected to the buffer for receiving the first and second differential clock signals and outputting the first and second filtered differential clock signals, respectively, wherein the first and second filtered differential clock signals have a phase difference of 180° therebetween.

5. The duty cycle correction circuit of claim 1, wherein each logic gate of the first and second pluralities of logic gates is an inverter, and wherein a count of inverters in the first and second pluralities of logic gates is an even number.

6. The duty cycle correction circuit of claim 1, further comprising a first resistive network that is connected to the low pass filter for receiving the first and second filtered clock signals and generating the first voltage signal.

7. The duty cycle correction circuit of claim 6, wherein the first resistive network includes:
   a first resistor connected to the low pass filter for receiving the first filtered clock signal; and
   a second resistor connected to the low pass filter for receiving the second filtered clock signal, wherein the first resistive network includes a voltage tap for outputting the first voltage signal.

8. The duty cycle correction circuit of claim 1, wherein the error amplifier receives the second voltage signal from a second resistive network.

9. The duty cycle correction circuit of claim 1, further comprising:
   a compensation circuit connected to the error amplifier, wherein the compensation circuit includes:
      a resistor having a first terminal connected to an output terminal of the error amplifier, and
      a capacitor connected to a second terminal of the resistor.

10. The duty cycle correction circuit of claim 1, wherein the differential amplifier further includes:
   a first load, wherein a first terminal of the first load is connected to a voltage source;
   a second load, wherein a first terminal of the second load is connected to the voltage source;
   a first metal oxide semiconductor field-effect transistor (MOSFET) having a first source terminal connected to a second terminal of the first load, and a first gate terminal connected to the low pass filter for receiving the first filtered clock signal;
   a second MOSFET having a second source terminal connected to a second terminal of the second load, and a second gate terminal connected to the low pass filter for receiving the second filtered clock signal; and
   a third MOSFET having a third source terminal connected to drain terminals of the first and second MOSFETs, a third gate terminal connected to the error amplifier for receiving the common mode error voltage signal, and a drain terminal coupled to ground.

11. A duty cycle correction circuit, comprising:
   first and second pluralities of logic gates for receiving first and second superimposed clock signals and generating first and second output clock signals, respectively;
   a low pass filter connected to the first and second pluralities of logic gates for receiving the first and second output clock signals and outputting first and second filtered clock signals;
   a first resistive network connected to the low pass filter for receiving the first and second filtered clock signals, and generating a first voltage signal, wherein the first voltage signal is an average of the first and second filtered clock signals;

an error amplifier that receives a second voltage signal, and is connected to the first resistive network for receiving the first voltage signal, compares the first voltage signal with the second voltage signal, and generates a common mode error voltage signal; and a differential amplifier connected to the low pass filter and the error amplifier for receiving the first and second filtered clock signals and the common mode error voltage signal, respectively, and outputting first and second error signals, wherein the differential amplifier superimposes the first and second error signals on first and second filtered differential clock signals for generating the first and second superimposed clock signals, respectively, and wherein the first and second pluralities of logic gates converge duty cycles of the first and second output clock signals towards a desired duty cycle based on the first and second superimposed clock signals, respectively.

12. The duty cycle correction circuit of claim 11, wherein the desired duty cycle is 50%.

13. The duty cycle correction circuit of claim 11, further comprising a buffer for receiving first and second clock signals and outputting first and second differential clock signals, respectively.

14. The duty cycle correction circuit of claim 13, further comprising first and second capacitors connected to the buffer for receiving the first and second differential clock signals and outputting the first and second filtered differential clock signals, respectively, wherein the first and second filtered differential clock signals have a phase difference of 180° therebetween.

15. The duty cycle correction circuit of claim 11, wherein each logic gate of the first and second pluralities of logic gates is an inverter, and wherein a count of inverters in the first and second pluralities of logic gates is an even number.

16. The duty cycle correction circuit of claim 11, wherein the first resistive network includes:

a first resistor connected to the low pass filter for receiving the first filtered clock signal; and a second resistor connected to the low pass filter for receiving the second filtered clock signal, wherein the first resistive network includes a voltage tap for outputting the first voltage signal.

17. The duty cycle correction circuit of claim 11, wherein the error amplifier receives the second voltage signal from a second resistive network.

18. The duty cycle correction circuit of claim 11, further comprising:

a compensation circuit connected to the error amplifier, wherein the compensation circuit includes:

a resistor having a first terminal connected to an output terminal of the error amplifier, and a capacitor connected to a second terminal of the resistor.

19. The duty cycle correction circuit of claim 11, wherein the differential amplifier further includes:

a first load, wherein a first terminal of the first load is connected to a voltage source;

a second load, wherein a first terminal of the second load is connected to the voltage source;

a first metal oxide semiconductor field-effect transistor (MOSFET) having a first source terminal connected to a second terminal of the first load, and a first gate terminal connected to the low pass filter for receiving the first filtered clock signal;

a second MOSFET having a second source terminal connected to a second terminal of the second load, and a second gate terminal connected to the low pass filter for receiving the second filtered clock signal; and a third MOSFET having a third source terminal connected to drain terminals of the first and second MOSFETs, a third gate terminal connected to the error amplifier for receiving the common mode error voltage signal, and a drain terminal coupled to ground.

* * * * *